US011211398B2

United States Patent
Herner et al.

(10) Patent No.: US 11,211,398 B2
(45) Date of Patent: Dec. 28, 2021

(54) METHOD FOR IN SITU PREPARATION OF ANTIMONY-DOPED SILICON AND SILICON GERMANIUM FILMS

(71) Applicant: SUNRISE MEMORY CORPORATION, San Jose, CA (US)

(72) Inventors: Scott Brad Herner, Lafayette, CO (US); Eli Harari, Saratoga, CA (US)

(73) Assignee: SUNRISE MEMORY CORPORATION, San Jose, CA (US)

(*) Notice: Subject to any disclaimer, the term of this patent is extended or adjusted under 35 U.S.C. 154(b) by 30 days.

(21) Appl. No.: 16/506,682

(22) Filed: Jul. 9, 2019

(65) Prior Publication Data

US 2020/0013799 A1    Jan. 9, 2020

Related U.S. Application Data

(60) Provisional application No. 62/695,334, filed on Jul. 9, 2018.

(51) Int. Cl.
*H01L 21/02* (2006.01)
*H01L 27/1157* (2017.01)
(Continued)

(52) U.S. Cl.
CPC .... *H01L 27/11582* (2013.01); *H01L 27/1157* (2013.01); *H01L 27/11524* (2013.01); *H01L 27/11556* (2013.01)

(58) Field of Classification Search
CPC .......... H01L 21/0257; H01L 21/02532; H01L 21/0262; H01L 21/02576; H01L 27/11582;
(Continued)

(56) References Cited

U.S. PATENT DOCUMENTS 10,236,177 B1 * 3/2019 Kohen ................. C23C 16/06
10,446,393 B2 * 10/2019 Bhargava .......... H01L 21/02573
(Continued)

OTHER PUBLICATIONS

Tandon, J.L., et al., "The annealing behavior of antimony implanted polycrystalline silicon", Applied Physics Letters 40, 3,, 1982, pp. 228-230.
(Continued)

*Primary Examiner* — Shahed Ahmed
*Assistant Examiner* — Khatib A Rahman
(74) *Attorney, Agent, or Firm* — Edward C. Kwok; VLP Law Group, LLP

(57) ABSTRACT

A process for forming an antimony-doped silicon-containing layer includes: (a) depositing by chemical vapor deposition the antimony-doped silicon-containing layer above a semiconductor structure, using an antimony source gas and a silicon source gas or a combination of the silicon source gas and a germanium source gas; and (b) annealing the antimony-doped silicon-containing layer at a temperature of no greater than 800° C. The antimony source gas may include one or more of: trimethylantimony (TMSb) and triethylantimony (TESb). The silicon source gas comprises one or more of: silane, disilane, trichlorosilane, (TCS), dichlorosilane (DCS), monochlorosilane (MCS), methylsilane, and silicon tetrachloride. The germanium source gas comprises germane.

12 Claims, 2 Drawing Sheets

(51) Int. Cl.
*H01L 27/11582* (2017.01)
*H01L 27/11556* (2017.01)
*H01L 27/11524* (2017.01)

(58) Field of Classification Search
CPC ........... H01L 27/1157; H01L 27/11578; H01L 27/11556; H01L 27/11524; H01L 29/0684
See application file for complete search history.

(56) References Cited

U.S. PATENT DOCUMENTS

| | | | | |
|---|---|---|---|---|
| 2005/0191826 | A1* | 9/2005 | Bauer | C30B 25/186 |
| | | | | 438/509 |
| 2006/0205194 | A1* | 9/2006 | Bauer | H01L 29/66636 |
| | | | | 438/542 |
| 2011/0124169 | A1* | 5/2011 | Ye | C30B 25/18 |
| | | | | 438/299 |
| 2012/0217561 | A1* | 8/2012 | Khakifirooz | H01L 27/1108 |
| | | | | 257/314 |
| 2012/0295427 | A1* | 11/2012 | Bauer | H01L 21/02579 |
| | | | | 438/494 |
| 2014/0120678 | A1* | 5/2014 | Shinriki | H01L 21/0262 |
| | | | | 438/283 |
| 2018/0019121 | A1* | 1/2018 | Bao | H01L 21/02381 |
| 2018/0033872 | A1* | 2/2018 | Bao | H01L 29/785 |
| 2018/0298488 | A1* | 10/2018 | Sakata | C23C 14/52 |

OTHER PUBLICATIONS

Walker, Andrew J., et al., "Sub-50-nm Dual-Gate Thin-Film Transistors for Monolithic 3-D Flash", IEEE Transactions on Electron Devices 56, No. 11, 2009, pp. 2703-2710.

\* cited by examiner

METHOD FOR IN SITU PREPARATION OF ANTIMONY-DOPED SILICON AND SILICON GERMANIUM FILMS

CROSS REFERENCE TO RELATED APPLICATIONS

The present application relates to and claims priority of U.S. provisional patent application ("Provisional Application"), Ser. No. 62/695,334, entitled "Method for in situ Preparation of Antimony-doped Silicon and Silicon Germanium films," filed on Jul. 9, 2018. The disclosure of the Provisional Application is hereby incorporated by reference in its entirety.

BACKGROUND OF THE INVENTION

1. Field of the Invention

The present invention relates to semiconductor circuit fabrication. In particular, the present invention relates to in situ formation of antimony-doped silicon or silicon germanium films.

2. Discussion of the Related Art

Three-dimensional (3-D) memory cells, such as those used in commercially available NAND memory, make use of doped polycrystalline silicon (polysilicon) films in the transistor, diode, resistor and other devices. It is advantageous to be able to dope the polysilicon films in situ (i.e., concurrently with the deposition of the polysilicon film), as compared to doping them ex situ (i.e., performed after deposition of the polysilicon film). Examples of ex situ doping techniques include ion implantation. In situ doping requires fewer processing steps than ex situ doping, and enables greater control of the distribution of the dopant atoms within the silicon or polysilicon film. Examples of dopants that have commonly been deposited by in situ doping of silicon are boron, phosphorus, and arsenic. It is important to note that in situ doped silicon films can be deposited as polycrystalline films, or as amorphous films, and then crystallized at a later step by annealing the deposited, amorphous film at an elevated temperature above 550° C. Finished 3-D memory devices most commonly include many layers of doped polycrystalline films. In this detailed description, although the silicon films are referred to as polysilicon (i.e., polycrystalline silicon) films, such silicon films may initially be deposited as amorphous or polycrystalline films.

Antimony is an example of an n-type dopant in silicon that has heretofore not been in situ deposited in silicon. Antimony has two advantageous properties that make its use in silicon-based 3-D memory circuits attractive: its low diffusivity and its low temperature of activation. FIG. 1 is a concentration-depth profile analysis of arsenic in a silicon film performed using secondary ion mass spectrometry (SIMS). To prepare the profile of FIG. 1, a 30 nm thick silicon film was implanted with arsenic ions. After a cleaning step that removed any oxide (e.g., $SiO_2$) layer on the 30-nm silicon film, a 120 nm thick silicon film was deposited on top of the arsenic-implanted silicon film. Portions of the combined films were then annealed at either 750° C. for 4 hours or 1000° C. for 5 seconds. FIG. 1 shows SIMS analyses on arsenic diffusion in the combined film (i) before annealing (i.e., as implanted), (ii) after annealing at 750° C. for 4 hours and (iii) after annealing at 1000° C. for 5 seconds. FIG. 2 is a concentration—depth profile analysis of antimony in a silicon film performed using SIMS. To prepare the profile of FIG. 2, a 30 nm thick silicon film was implanted with antimony ions. After a cleaning step to remove any $SiO_2$ layer on the 30 nm silicon film, a 120 nm silicon film was deposited on top of the antimony-implanted silicon film. Portions of the combined films were annealed at either 750° C. for 4 hours or 1000° C. for 5 seconds. FIG. 2 shows SIMS analyses on antimony diffusion in the combined film (i) before annealing (i.e., as implanted), (ii) after annealing at 750° C. for 4 hours and (iii) after annealing at 1000° C. for 5 seconds. FIGS. 1 and 2 show that antimony diffuses more slowly than arsenic.

Most dopant atoms in silicon "activate." (Activation is the process by which a dopant atom replaces a silicon atom in the lattice, thereby providing a charge carrier). Unlike many other common dopant atoms, antimony does not necessarily activate more readily in polysilicon with increasing activation temperature. See, e.g., "The annealing behavior of antimony implanted polycrystalline silicon," by J. L. Tandon, H. B. Harrison, C. L. Neoh, K. T. Short, and J. S. Williams, *Applied Physics Letters* 40 (1982), 3, pp. 228-230, and "Sub-50-nm Dual-Gate Thin-Film Transistors for Monolithic 3-D Flash," by Andrew J. Walker, *IEEE Transactions on Electron Devices* 56, no 11 (2009), pp. 2703-2710. Annealing temperatures of between 600 and 800° C. have been shown to be optimal for activation and achieving lowest sheet resistance.

Low diffusivity is important for obtaining and maintaining throughout the fabrication process sharp delta-like junctions in the devices, and for enabling small devices. A low activation temperature also provides the same advantages by minimizing the diffusion of other dopants, such as boron, in the devices. In situ deposition of antimony-doped films has been achieved in molecular beam epitaxy (MBE). However, MBE is not an appropriate mass production technique and does not have good step coverage. (Step coverage is the ability of a deposited film to evenly deposit on a substrate that contains significant topography or steps.) For example, a deposition technique with good step coverage would allow a film deposited inside a trench to have roughly the same thickness on the sidewalls of the trench as on the horizontal surfaces above the trench.

Recently developed gas sources for metal-organic chemical vapor deposition (MOCVD) of antimony-containing III-V and II-VI semiconductor compounds enable in situ antimony doping of silicon films.

SUMMARY

The present invention provides a method for depositing in situ antimony-doped silicon, as well as some uses in 3-D memory circuits.

According to one embodiment of the present invention, a process for forming an antimony-doped silicon-containing layer includes: (a) depositing by chemical vapor deposition the antimony-doped silicon-containing layer above a semiconductor structure, using an antimony source gas and a silicon source gas or a combination of the silicon source gas and a germanium source gas; and (b) annealing the antimony-doped silicon-containing layer at a temperature of no greater than 800° C. The antimony source gas may include one or more of: trimethylantimony (TMSb) and triethylantimony (TESb). The silicon source gas comprises one or more of: silane, disilane, trichlorosilane, (TCS), dichlorosilane (DCS), monochlorosilane (MCS), methylsilane, and silicon tetrachloride. The germanium source gas comprises germane.

In one embodiment, the antimony-doped silicon-containing layer is deposited into a cavity formed by removal of a sacrificial layer.

A process of the present invention may further include: (a) forming an n-type semiconductor layer above the semiconductor structure; and (b) annealing the n-type semiconductor layer at a temperature higher than 900° C., prior to annealing the antimony-doped silicon-containing layer.

The process of the present invention may be used to form a storage transistor, which includes (a) first and second n-doped polysilicon layers serving, respectively as a drain region and a source region of the storage transistor; (b) one or more in situ antimony-doped silicon-containing layers of the present invention, at least one of which being adjacent to one of the first and second n-doped polysilicon layers; (c) an intrinsic or lightly-doped p-doped semiconductor layer between the first and second n-doped polysilicon layer, serving as channel region for the storage transistor; (d) a conductor serving as a gate electrode for the storage transistor; and (e) a charge storage layer between the intrinsic or lightly-doped p-doped semiconductor layer. In one embodiment, the storage transistor shares the first and second n-doped polysilicon layers with an adjacent like storage transistor. In that embodiment, the channel region for the storage transistor and the channel region for the like storage transistor are separated by a p-doped semiconductor layer. In the formation of the storage transistor, the n-doped polysilicon layers are annealed at a temperature higher than 900° C., prior to annealing the antimony-doped silicon-containing layer at a lower temperature no greater than 900° C.

The n-doped polysilicon layers may also be antimony-doped.

The present invention is better understood upon consideration of the detailed description below in conjunction with the drawings.

BRIEF DESCRIPTION OF THE DRAWINGS

To simplify the detailed description, like elements in the figures are assigned like reference numerals.

DETAILED DESCRIPTION OF THE PREFERRED EMBODIMENTS

Antimony-doped silicon films can be deposited by low pressure chemical vapor deposition (LPCVD) techniques. In such an LPCVD process, source gases of antimony may include, for example, trimethylantimony (TMSb) and triethylantimony (TESb). See, e.g., the articles: (i) "The metal-organic chemical vapor deposition and properties of III-V antimony-based semiconductor materials," by Robert Biefield, *Materials Science and Engineering R* 36 (2002), pp. 105-142; and (ii) "Room temperature operation of $In_xGa_{1-x}Sb/InAs$ type II quantum well infrared photodetectors grown by MOCVD," by D. H. Wu, Y. Y. Zhang, and M. Razeghi, *Applied Physics Letters* 112 (2018), pp. 111103-111107. Source gases of silicon include silane, disilane, trichlorosilane, (TCS), dichlorosilane (DCS), monochlorosilane (MCS), methylsilane, and silicon tetrachloride. Source gases of germanium include germane.

Flowing one or more antimony source gases with one or more silicon source gases, or with a combination of silicon and germanium source gases, over a target substrate at a temperature between 400° C. and 900° C., preferably no greater than 800° C., and a pressure between 1 and 4000 mTorr, deposits antimony-doped silicon films or antimony-doped silicon germanium films. While common dopant gases for in situ doping of silicon are chlorides or hydrides—namely boron tri chloride ($BCl_3$), diborane ($B_2H_6$), phosphine ($PH_3$), and arsine ($AsH_3$)—precursors to these dopant gases (e.g., trimethylboron (TMB)) have been successfully used in MOCVD to in situ dope silicon. One example such a MOCVD precursor process is disclosed in "Structural and electrical properties of trimethylboron-doped silicon nanowires," by K.-K. Lew et al., *Applied Physics Letters* 85, 15 (2004) pp. 3101-3103. Helium, nitrogen, and argon are other gases that may also be included with the silicon- and antimony-containing gases.

Figure 3:
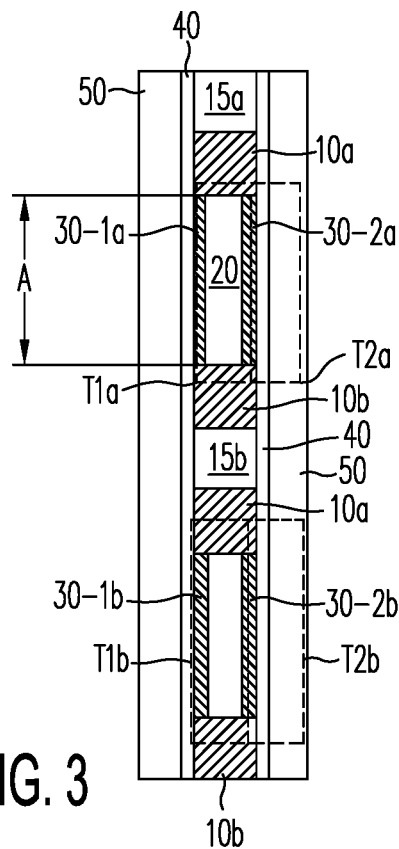
FIG. 3 shows a cross section of 3-D memory structure 300 that includes in situ antimony-doped silicon films, according to one embodiment of the present invention.

FIG. 3 shows a cross section of 3-D memory structure 300 that includes in situ antimony-doped silicon films, according to one embodiment of the present invention. FIG. 3 shows four memory cells in memory structure 300. Specifically, FIG. 3 shows that adjacent memory cells T1a and T2a are formed above adjacent memory cells T1b and T2b, with memory cells T1a and T2a being isolated from memory cells T1b and T2b by dielectric layer 15b. Memory cells T1a and T2a share common source region 10a and common drain region 10b, which are both e doped silicon layers (e.g., in situ antimony-doped silicon layers). Likewise, memory cells T1b and T2b also share common source and drain regions, which are also respectively labeled 10a and 10b in FIG. 3, indicating that they are constituted and formed in like manner as the e doped silicon layers associated with common source region 10a and common drain region 10b of memory cells T1a and T2a.

Figure 1:
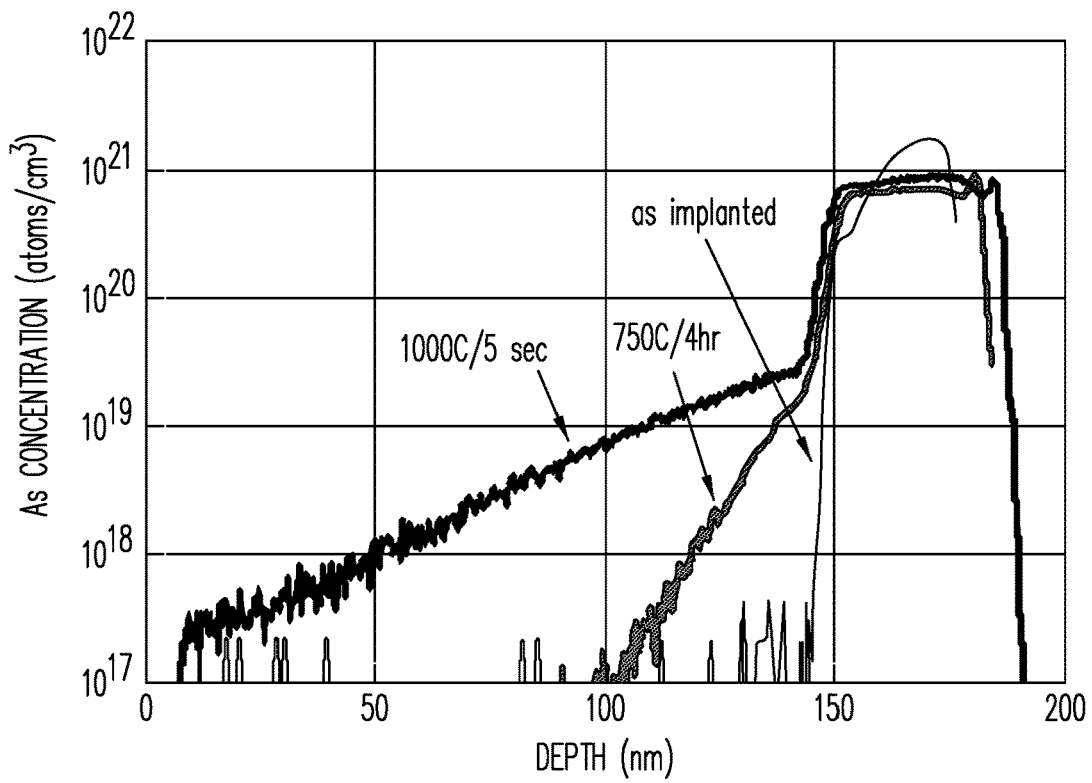
FIG. 1 shows SIMS analyses on arsenic diffusion in an implanted silicon film (i) before annealing (i.e., as implanted), (ii) after annealing at 750° C. for 4 hours and (iii) after annealing at 1000° C. for 5 seconds.
Figure 2:
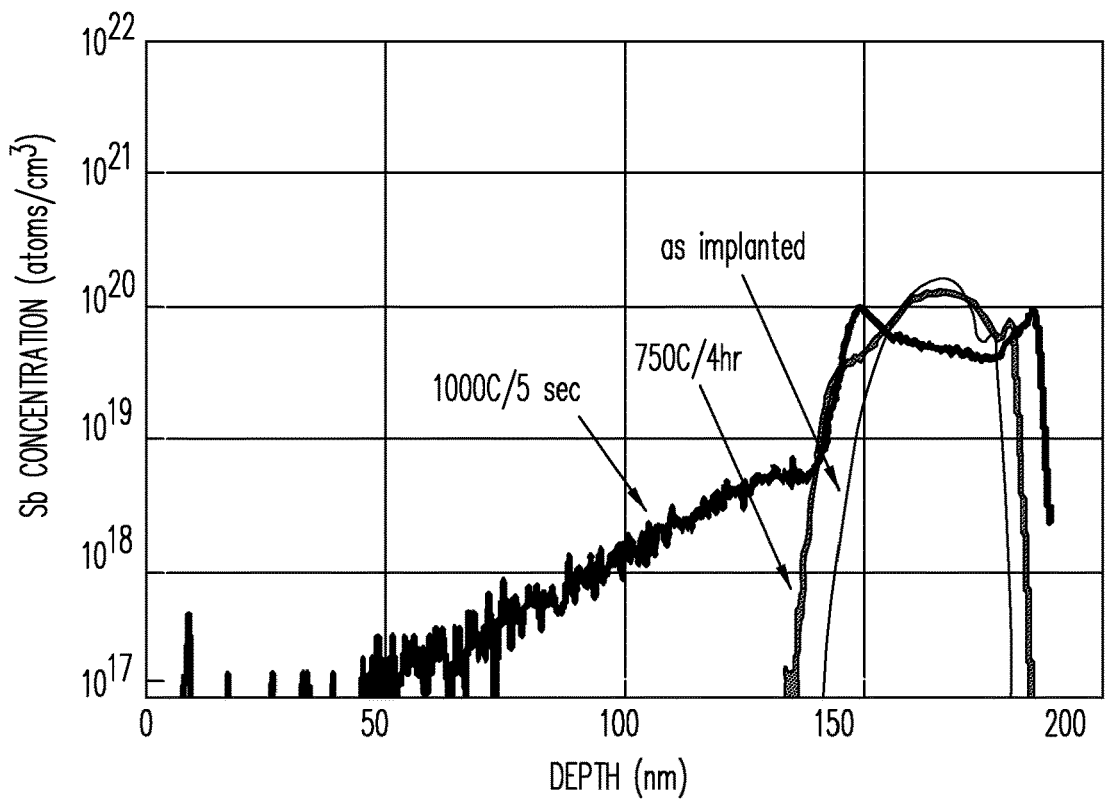
FIG. 2 shows SIMS analyses on antimony diffusion in an implanted silicon, film (i) before annealing (i.e., as implanted), (ii) after annealing at 750° C. for 4 hours and (iii) after annealing at 1000° C. for 5 seconds.

Memory cells T1a, T2a, T1b and T1b include $p^-$ channel regions 30-1a, 30-2a, 30-1b and 30-2b, respectively, provided between respective common source regions 10a and common drain regions 10b. Channel regions 30-1a and 30-2a are separated laterally from each other by p-type material 20. Likewise, channel regions 30-1b and 30-2b are separated from each other laterally by p-type material 20 Over channel regions 30-1a, 30-2a, 30-1b and 30-2b are provided charge storage material 40 and conductors 50 for formation of gate electrodes. In FIG. 3, the length A of each channel region are reduced—relative to non in situ doped silicon films—because diffusion of antimony atoms from the in situ antimony-doped silicon films (i.e., common source region 10a and common drain region 10b) into $p^-$-doped channel regions 30-1a, 30-2a, 30-1b and 30-2b is minimal, as already suggested from the concentration-depth profile of FIG. 2. Were it not the case, n-type dopant diffusion into the $p^-$-doped channels may overwhelm the p-type doping, causing the $p^-$-doped channel region to become n-type, thereby destroying the transistor. A reduced channel length (i.e., length A) provides memory structure 300 with a lower aspect ratio[1] and a higher channel current each memory cell.

Figure 4A:
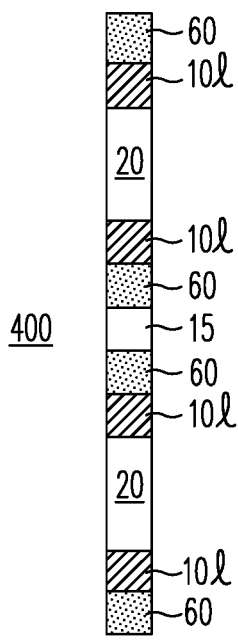
FIGS. 4A and 4B illustrate fabricating $N^+$ common source regions and common drain regions in a 3-D memory structure using a "replacement process", in accordance with one embodiment of the present invention.
Figure 4B:
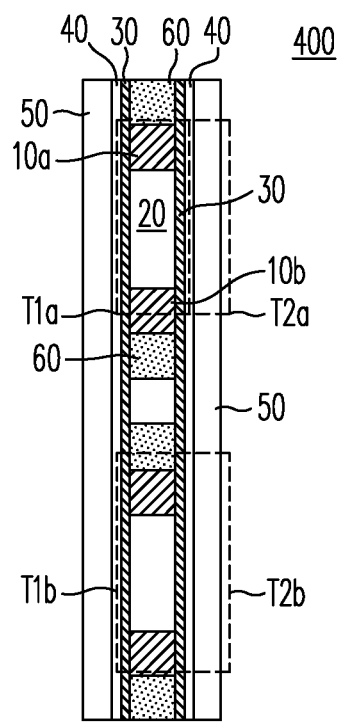

FIGS. 4A and 4B illustrate fabricating e common source regions and common drain regions in a 3-D memory structure using a "replacement process", in accordance with one embodiment of the present invention. In the replacement process of FIGS. 4A and 4B, a sacrificial material is first provided in memory structure 400 to stand in place of common source region 10a and common drain region 10b, until the final form of memory structure 300 is almost complete. Use of sacrificial materials is described in greater detail in copending U.S. patent application ("Copending Application"), Ser. No. 15/248,420, entitled "Capacitive-Coupled Non-volatile Thin-film Transistor NOR Strings in Three-Dimensional Arrays," filed on Aug. 26, 2016. The disclosure of the Copending Application is hereby incorporated by reference in its entirety.

FIG. 4A shows partially fabricated memory structure 400, in which each of p-type layers 60 is fabricated adjacent each of sacrificial material layers 10t. Each of sacrificial material layers 10t is to be replaced at a subsequent step by an antimony-doped silicon layer, which becomes either one of common source regions 10a or one of common drain regions 10b. (In some embodiments, the layers in FIGS. 4A and 4B labeled by reference numeral 20 need not be a p-type material, as described above with respect to FIG. 3, but may be provided as a dielectric material.) After p-type layers 60 are formed and before the channel regions are formed, p-type layers 60 are annealed at an elevated temperature (e.g. 1000° C.), which enables the dopant atoms in p-type layers 60 to become highly activated. By annealing at a high temperature before fabrication of other layers (e.g., the channel regions), boron diffusion into such areas (e.g., the channel regions) is avoided. After annealing, sacrificial material layers 10t are removed and replaced by in situ antimony-doped silicon layers. As stated earlier, antimony atoms can be highly activated at a lower temperature (e.g. 750° C.), thus avoiding significant n-type dopant diffusion into p-type regions (e.g., the channel regions).

FIG. 4B shows memory structure 400, after sacrificial material layers 10t are replaced by in situ antimony-doped silicon layers to provide respective common source regions 10a and common drain regions 10b. FIG. 4b also shows channel regions 30, charge storage material 40 and conductors 50 designated for forming gate electrodes. In memory structures 300 and 400 above, p-type layers 20 in FIG. 3 or p-type layers 60 in FIGS. 4A and 4B are provided to supply additional charge carriers (i.e., holes) to the channel regions.
$\neq$[1] In this context, the aspect ratio of a feature is its height divided by its width
The additional charge carriers may be helpful in erase operations. P-type layers 20 in FIG. 3 may have a different dopant concentration from channel regions 30-1a, 30-2a, 30-1b and 30-2b, but are connected electrically to channel regions 30-1a, 30-2a, 30-1b and 30-2b to supply additional charge carriers to the channel regions. In situ doping of both p$^+$ and n$^+$ polysilicon or polysilicon-germanium layers are particularly suited for replacement processes used in forming multi-layer memory structures, as the high aspect ratios in such memory structures preclude ex situ doping processes, such as ion implantation. In situ antimony-doped silicon or silicon-germanium layers are particularly suitable for applications in which a p$^+$ layer is desired in the vicinity of, or in contact with a p$^-$ doped channel region or with an n$^+$ source or drain layer. In such applications, boron dopant diffusion cannot be tolerated and high activation of the p$^+$ layer is desirable.

In some embodiments, p$^+$-doped silicon germanium "hole donor" layers are more advantageous than p$^+$-doped silicon "hole donor" layers, because of their more favorable etching rates. For a given etchant, silicon germanium and silicon films can achieve different etch rates. In general, a silicon germanium film tends to etch at a faster rate than a silicon film. For example, when p-type layer 20 is implemented by a p$^+$-doped silicon germanium layer, the silicon germanium layer can be recessed by a selective etch to allow silicon channel regions 30-1a, 30-2a, 30-1b and 30-2b to be accommodated in the recesses. In the etch step to form the recesses, common source regions 10a and common drain regions 10b are not etched, or minimally etched, in comparison to p$^+$-doped silicon germanium layer 20.

Generally, in situ doped silicon germanium films may also be advantageous for decreasing the thermal budget relative to in situ doped silicon films. For example, while amorphous silicon films crystallize at 550° C., amorphous germanium films crystallize at 400° C. Amorphous silicon germanium films crystallize at a temperature between 400° C. and 550° C., depending on the relative fractions of silicon and germanium. Also, dopants activate in silicon germanium films at typically lower temperatures than in silicon films.

In situ antimony-doping allows precise control of the metallurgical doping concentration[2], from $1.0 \times 10^{16}$ cm$^{-3}$ to $1.0 \times 10^{21}$ cm$^{-3}$, depending on: the relative ratio of the antimony source gas or gases to the silicon source gas or gases used, and the temperature and the pressure during deposition. For example, a low concentration in situ antimony-doped silicon film (e.g., $1.0 \times 10^{17}$ cm$^{-3}$) may be used as a channel region film in a transistor, while

[2] While antimony can be doped metallurgically to a concentration greater than $1.0 \times 10^{20}$ cm$^{-3}$, the active concentration is generally limited to no greater than $5.0 \times 10^{19}$ cm$^{-3}$. Hence, the term "metallurgical doping concentration" is used more often than the term "active doping concentration". a higher concentration in situ antimony-doped silicon film (e.g., $1.0 \times 10^{19}$ cm$^{-3}$) may be used in the source and drain regions of the transistor.

The above detailed description is provided to illustrate specific embodiments of the present invention and is not intended to be limiting. Numerous modifications and variations within the scope of the present invention are possible. The present invention is set forth in the accompanying claims.

We claim:

1. A process, comprising:
   exposing a surface of a semiconductor structure; and
   flowing over the surface of the semiconductor structure an antimony source gas and a silicon source gas or a combination of the silicon source gas and a germanium source gas, so as to deposit by chemical vapor deposition an antimony-doped silicon-containing layer that has an antimony dopant concentration between $1.0 \times 10^{16}$ atoms cm$^{-3}$ and $1.0 \times 10^{19}$ atoms cm$^{-3}$, the deposition being carried out at a temperature no greater than 900° C., wherein the antimony-doped silicon-containing layer is deposited into a cavity formed by removal of a sacrificial layer.

2. The process of claim 1, wherein the antimony source gas comprises one or more of: trimethylantimony (TMSb) and triethylantimony (TESb).

3. The process of claim 1, wherein the silicon source gas comprises one or more of: silane, disilane, trichlorosilane, (TCS), dichlorosilane (DCS), monochlorosilane (MCS), methylsilane, and silicon tetrachloride.

4. The process of claim 1, wherein the germanium source gas comprises germane.

5. A process, comprising:
   exposing a surface of a semiconductor structure;

flowing over the surface of the semiconductor structure an antimony source gas and a silicon source gas or a combination of the silicon source gas and a germanium source gas, so as to deposit by chemical vapor deposition an antimony-doped silicon-containing layer that has an antimony dopant concentration between $1.0 \times 10^{16}$ atoms $cm^{-3}$ and $1.0 \times 10^{19}$ atoms $cm^{-3}$, the deposition being carried out at a temperature no greater than 900° C.;

forming an n-type semiconductor layer above the semiconductor structure; and annealing the n-type semiconductor layer at a temperature higher than 800° C., prior to annealing the antimony-doped silicon-containing layer.

6. The process of claim 1, wherein the temperature is no greater than 800° C.

7. The process of claim 1, wherein the temperature is no greater than 750° C.

8. The process of claim 5, wherein the antimony source gas comprises one or more of: trimethylantimony (TMSb) and triethylantimony (TESb).

9. The process of claim 5, wherein the silicon source gas comprises one or more of: silane, disilane, trichlorosilane, (TCS), dichlorosilane (DCS), monochlorosilane (MCS), methylsilane, and silicon tetrachloride.

10. The process of claim 5, wherein the germanium source gas comprises germane.

11. The process of claim 5, wherein the deposition temperature is no greater than 800° C.

12. The process of claim 5, wherein the deposition temperature is no greater than 750° C.

* * * * *